(12) United States Patent
Esser et al.

(10) Patent No.: US 8,596,626 B2
(45) Date of Patent: Dec. 3, 2013

(54) WORKPIECE CARRIER DEVICE

(75) Inventors: Stefan Esser, Aachen (DE); Martin Zäch, Liechtenstein (CH)

(73) Assignee: Oerlikon Trading AG, Trubbach, Trubbach (CH)

( * ) Notice: Subject to any disclaimer, the term of this patent is extended or adjusted under 35 U.S.C. 154(b) by 403 days.

(21) Appl. No.: 12/681,833

(22) PCT Filed: Oct. 2, 2008

(86) PCT No.: PCT/EP2008/008349
§ 371 (c)(1),
(2), (4) Date: Jun. 14, 2010

(87) PCT Pub. No.: WO2009/046928
PCT Pub. Date: Apr. 16, 2009

(65) Prior Publication Data
US 2010/0270722 A1    Oct. 28, 2010

(30) Foreign Application Priority Data
Oct. 8, 2007    (EP) .................................... 07405302

(51) Int. Cl.
*B23Q 1/25*    (2006.01)
*B23Q 1/64*    (2006.01)
*A47B 91/00*    (2006.01)

(52) U.S. Cl.
USPC ............... 269/57; 269/55; 269/56; 248/349.1

(58) Field of Classification Search
USPC ............... 269/57, 55, 56, 900, 61, 66, 67, 81, 269/262; 248/349.1; 118/500, 730
See application file for complete search history.

(56) References Cited

U.S. PATENT DOCUMENTS

2007/0057138 A1*    3/2007    Esser ......................... 248/349.1

* cited by examiner

*Primary Examiner* — Lee D Wilson
*Assistant Examiner* — Seahee Yoon
(74) *Attorney, Agent, or Firm* — Notaro, Michalos & Zaccaria P.C.

(57) ABSTRACT

A workpiece carrier (2) comprises a rotary frame (3) and a driving part (22), both of which are rotatable about a driving axle (4). The rotary frame (3) can be driven by a motor (6), and carries a plurality of workpiece holders (13) which are distributed around the driving axle (4) so as to be rotatable about holder axes. Mounted in the driving part (22) on a mount is a pinion (25) which engages with a stationary central wheel (21) and a ring gear (27) of a transmission part (26), at the centre of which lies an output point (29) which is at a distance of an eccentricity from the driving axle (4). Driving apertures (28) on the transmission part (26), through which driving pins (19) of the workpiece holders (13) project, are also at the distance of the eccentricity from the holder axes. On rotation of the rotary frame (3), the driving part (22) revolves about the driving axle (4) and additionally imposes on the transmission part (26), which rotates concomitantly with the rotary frame (3), an eccentric motion such that the output point (29) circles round the driving axle (4), as a result of which corresponding rotation of the workpiece holders (13) is effected.

20 Claims, 5 Drawing Sheets

US 8,596,626 B2

WORKPIECE CARRIER DEVICE

FIELD OF THE INVENTION

The invention relates to a workpiece carrier device according to the preamble of claim 1. Such devices are used for the processing of workpieces, especially in vacuum appliances, and in particular for coating said workpieces.

PRIOR ART

WO 2007/025 397 A1 discloses a workpiece carrier device of the generic type, in which the transmission part is realized as a driving disc which is eccentrically joined to a rotational axle which is closely surrounded by a corresponding recess on the transmission part. It is possible to influence the transmission ratio between the rotation of the workpieces and that of the rotary frame only via an auxiliary gear set which directly controls the motion of the driving disc.

A further workpiece carrier device is known from EP 1 153 155 A1. In this case, the workpiece holders rotatably mounted on rotary frames are rotated in that in each case a toothed wheel on the workpiece holder engages with a ring gear which coaxially surrounds the drive axis of the rotary frame and is torsionally rigid in relation to the base frame. This known workpiece carrier device is of a relatively complex structure. The transmission ratio is selectable only within fairly narrow limits.

In the case of one of the workpiece carrier devices disclosed by DE 198 03 278 A1, the rotation of the workpiece holders is effected by drivers which are anchored to the base frame and engage temporarily with said workpiece holders. In this case, the rotation is intermittent, which is usually disadvantageous per se and can impair the quality of the workpieces, especially when a coating consisting of a plurality of very thin layers is being applied.

DE 103 08 471 A1 discloses a workpiece carrier device in which workpiece carriers are disposed on a rotary frame in a plurality of concentric rings. Each workpiece carrier of a ring is made to rotate by an intermediate gear set engaging with a stationary central wheel on the rotary frame. The workpiece carriers pertaining to a ring are operatively connected to one another in such a way that this rotation is transmitted to the remaining workpiece carriers.

SUMMARY OF THE INVENTION

The invention is based on the object of disclosing a workpiece carrier device of the generic type, which is of a simple structure and reliable and allows the transmission ratio to be adjusted in a simple manner. This object is achieved by the features in the characterizing portion of claim 1.

The advantages achieved by the invention are that, in particular, the driving of the workpiece holders is very simple and nevertheless allows the transmission ratio to be selected from a comparatively wide range.

BRIEF DESCRIPTION OF THE DRAWINGS

The invention is explained more fully in the following with reference to figures which represent merely exemplary embodiments, and wherein.

DESCRIPTION OF THE PREFERRED EMBODIMENTS

Figure 1:
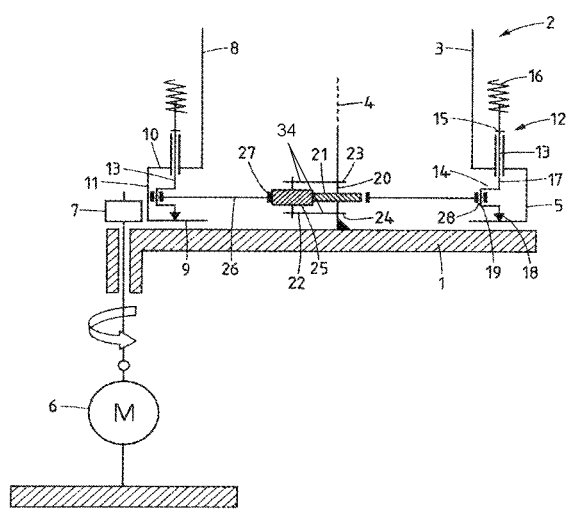
FIG. 1 shows, in schematic form, an axial section through a workpiece carrier device of the invention, according to a first embodiment.

According to a preferred embodiment of a workpiece carrier device (FIG. 1) of the invention, there is disposed on a stationary base frame 1 a workpiece carrier 2, having a rotary frame 3 which is mounted on the base frame 1 so as to be rotatable about vertical drive axis 4 and, at the lower end, carries on its exterior a ring gear 5 with which there engages a toothed wheel 7 driven by a motor 6. The rotary frame 3 is realized as a closed housing which is approximately rotationally symmetrical about the drive axis 4 and has central tubular portions 8 between which are located, along the drive axis 4, successive projections (only the lowest is shown in FIG. 1, see also FIG. 4), each constituted by a bottom part 9, a cover 10 and an outer ring 11 that is concentric relative to the tubular portions 8, said outer ring 11 being joined to the outer edge of the bottom part 9 and projecting somewhat over the outer edge of the cover 10.

The rotary frame 3 carries, on each of the said projections, a group 12 of workpiece holders 13, respectively distributed at the same level and in a uniform manner over a circle surrounding the drive axis 4. Each workpiece holder 13 is rotatable about a holder axis that is parallel to the drive axis 4, and comprises a base 14, which is located partly within a projection of the rotary frame 3, and a mount 15 for securing a workpiece 16, said mount 15 being joined to the base 14 via an axle pin 17 which is brought through the cover 10. The base 14 furthermore comprises a bearing pin 18 having a downwardly facing conical tip, the axis of which, as in the case of the axle pin 17, is coincident with the holder axis and is rotatably mounted in the bottom part 9, where the tip engages in a corresponding recess. The bearing pin 18 and the axle pin 17 are respectively joined by a crank-type intermediate portion comprising a driving pin 19 which is parallel to, but at a distance from, the holder axis. The base 14 is a simple bent part of substantially uniform cross-section. The fitted-on mount 15 has a cylindrical recess, open at the top, into which the workpiece 16, e.g. a milling head, is inserted.

A shaft 20 which is non-rotatably anchored to the base frame 1 carries at the level of each of the groups 12 a central wheel 21 which is torsionally rigid in relation to the base frame 1 (see also FIGS. 2, 3) with outer toothing. Disposed in each case at the same level is a driving part 22 comprising a mount 34 which is rotatable about the drive axis 4 and mount 34 has an upper arm 23 lying above the central wheel 21 and a similar lower arm 24 lying below the central wheel 21 and also an intermediate gear set which is attached to the mount and in the example consists merely of a pinion 25 which is mounted between the upper arm 23 and the lower arm 24 and is rotatable about a pinion axis parallel to the drive axis 4 and the toothing of which engages with that of the central wheel 21.

The pinion 25 is joined to the driving pins 19 of the group 12 of workpiece carriers 13 lying at the level of the central wheel 21 and the driving part 22 by a transmission part 26 having a circular central coupling cutout. The edge of said cutout carries an inwardly pointing ring gear 27 which engages with the toothing of the pinion 25. Further outward, the transmission part 26 has for each workpiece holder 13 a driving aperture 28 through which there projects the driving pin 19 of said workpiece holder 13, said driving pin 19 being closely surrounded by the edge of said driving aperture 28. The transmission part 26 is therefore in each case connected in a rotatable manner, but otherwise with little play, to the workpiece holders 13 and is in engagement with the driving part 22, more precisely the pinion 25 thereof.

The centre point of the ring gear 27 on the transmission part 26 constitutes an output point 29 which is at a distance of an eccentricity E from the drive axis 4. The distance of the driving pin 19 of each workpiece holder 13 from the respective holder axis likewise corresponds to the eccentricity E.

Figure 2:
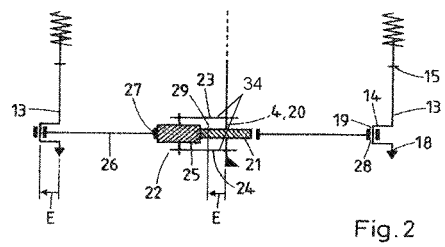
FIG. 2 shows a detail from FIG. 1.
Figure 3:
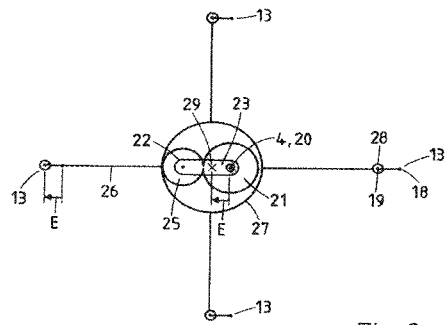
FIG. 3 shows a top view of the detail according to FIG. 2.

The transmission part 26, which is represented in schematic form only in FIGS. 2, 3, may be realized as a flat stamped part (see FIG. 4 in which a projection is shown but parts of the housing, most workpiece carriers 13 and the shaft 20 are omitted) having an inner ring 30, which surrounds the said coupling cutout, and an outer ring 31, in which there are provided, distributed over the circumference, in this case sixty-six driving apertures 29 for engagement with the same number of workpiece carriers 13. The inner ring 30 and the outer ring 31 are connected through radial spokes 32 which, in the example, are weakened by holes 33 such that they constitute predetermined breaking points which break in the event of an obstruction of one of the workpiece holders 13 of the respective group 12.

When the rotary frame 3 is rotated about the drive axis 4 by the motor 6, the transmission part 26 engaging with the workpiece carriers 13 connected to the rotary frame 3 is driven concomitantly via said workpiece carriers 13. As the toothing of the pinion 25 engages with the ring gear 27, said pinion 25 is also made to rotate and runs off on the central wheel 21, as a result of which the driving part 22 is rotated in relation to the transmission part 26 and effects an eccentric motion thereof in which the vector connecting the rotational axle 4 to the output point 29, the length of which vector corresponds to the eccentricity E, revolves about the rotational axle 4. The eccentric motion is transmitted to the driving pins 19, so that each revolution of the eccentric motion effects a rotation of the workpiece carriers 13, the vector pointing from the holder axis to the corresponding driving pin 19 being in each case parallel at all times to the above-mentioned vector.

If the motions of the transmission part 26 and the driving part 22 are viewed in a coordinate system fixed on the base frame 1 (see in this regard FIGS. 3, 5; in the latter the cover 10 is omitted) and if the number of teeth of the central toothing, i.e. the toothing of the central wheel 21, is denoted by $Z_Z$ and that of the transmission toothing, i.e. the toothing of the ring gear 27, by $Z_U$, there is obtained on rotation of the driving part 22 about the drive axis 4 in the clockwise direction, corresponding to a revolution during the eccentric motion of the transmission part 26, i.e. $U_U$=1, a rotation U.sub.D thereof and thus of the rotary frame 3 of $$U_D = 1 + Z_Z/Z_U \quad (1)$$

rotations in the clockwise direction. For $z = Z_Z/Z_U$, the following therefore applies $$U_D : U_U = 1 + z \quad (1')$$

This results from the fact that the transmission part 26 on the one hand rotates concomitantly, i.e. also performs a full rotation in the clockwise direction, and on the other hand is additionally rotated through z rotations by the pinion 25 running off on the central wheel 21. After 1+z rotations of the rotary frame 3, there is therefore a rotation of the driving part 22. There is thus obtained for the transmission ratio, i.e. the quotient between the rate of rotation of the driving part 22 and thus the eccentric motion of the transmission part 26 on the one hand and the rate of rotation of the rotary frame 3 on the other hand, $$u = \frac{U_U}{U_D} = \frac{1}{1+z} \quad (2)$$

Figure 4:
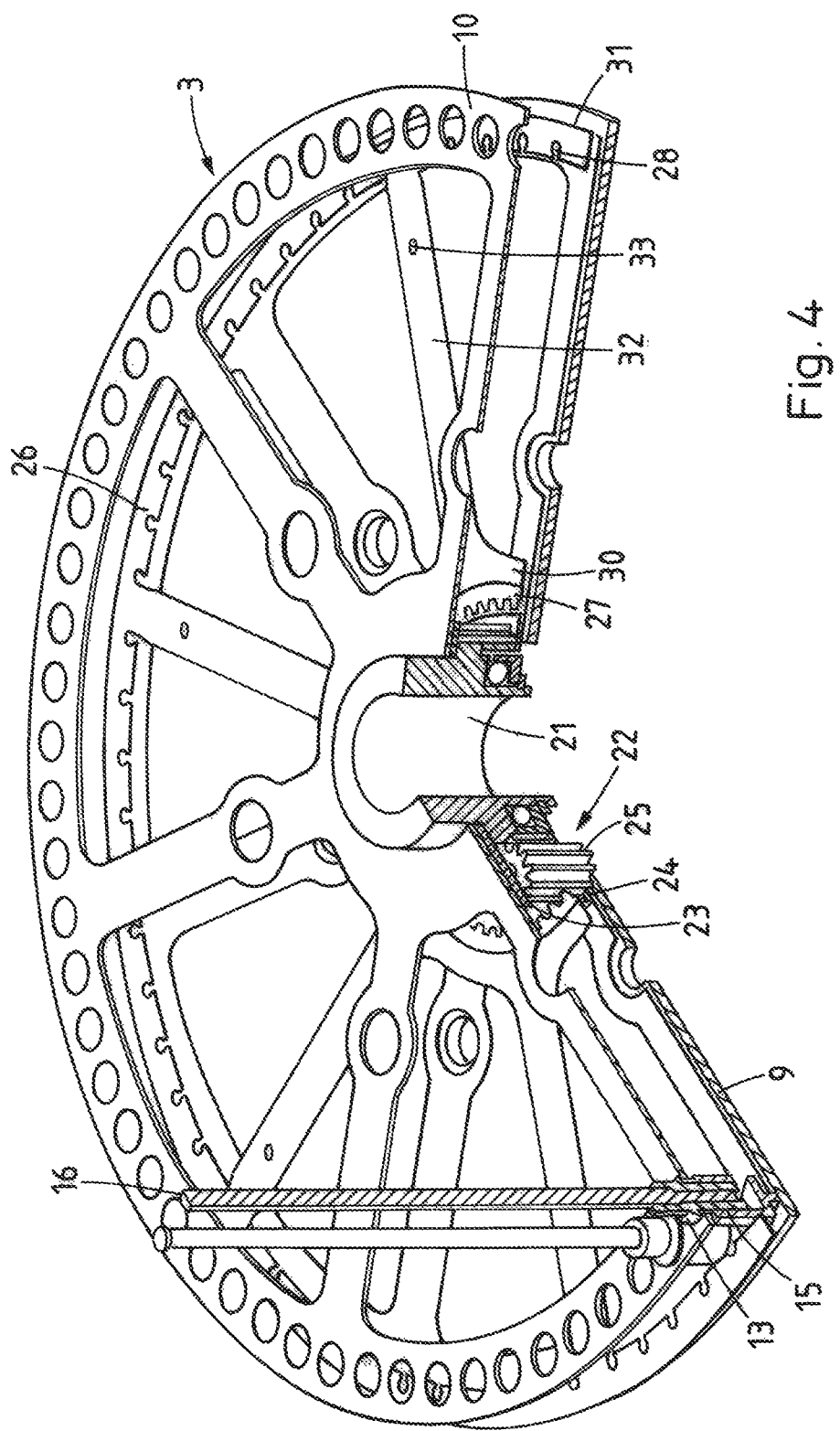
FIG. 4 shows, in partial section, a portion of the workpiece carrier device of the invention, in a perspective view
Figure 5:
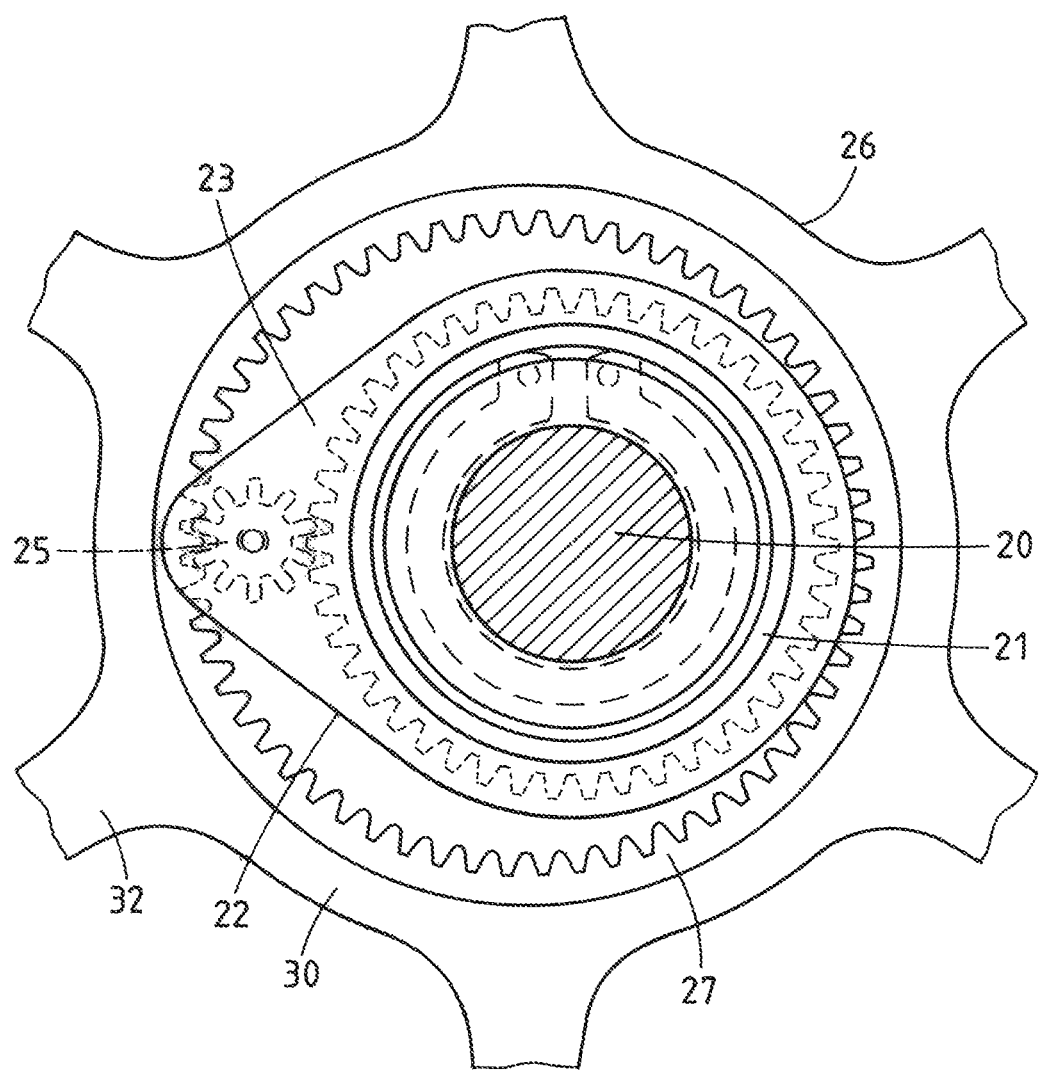
FIG. 5 shows an enlarged top view of a portion of the workpiece carrier device of the invention.
Figure 6:
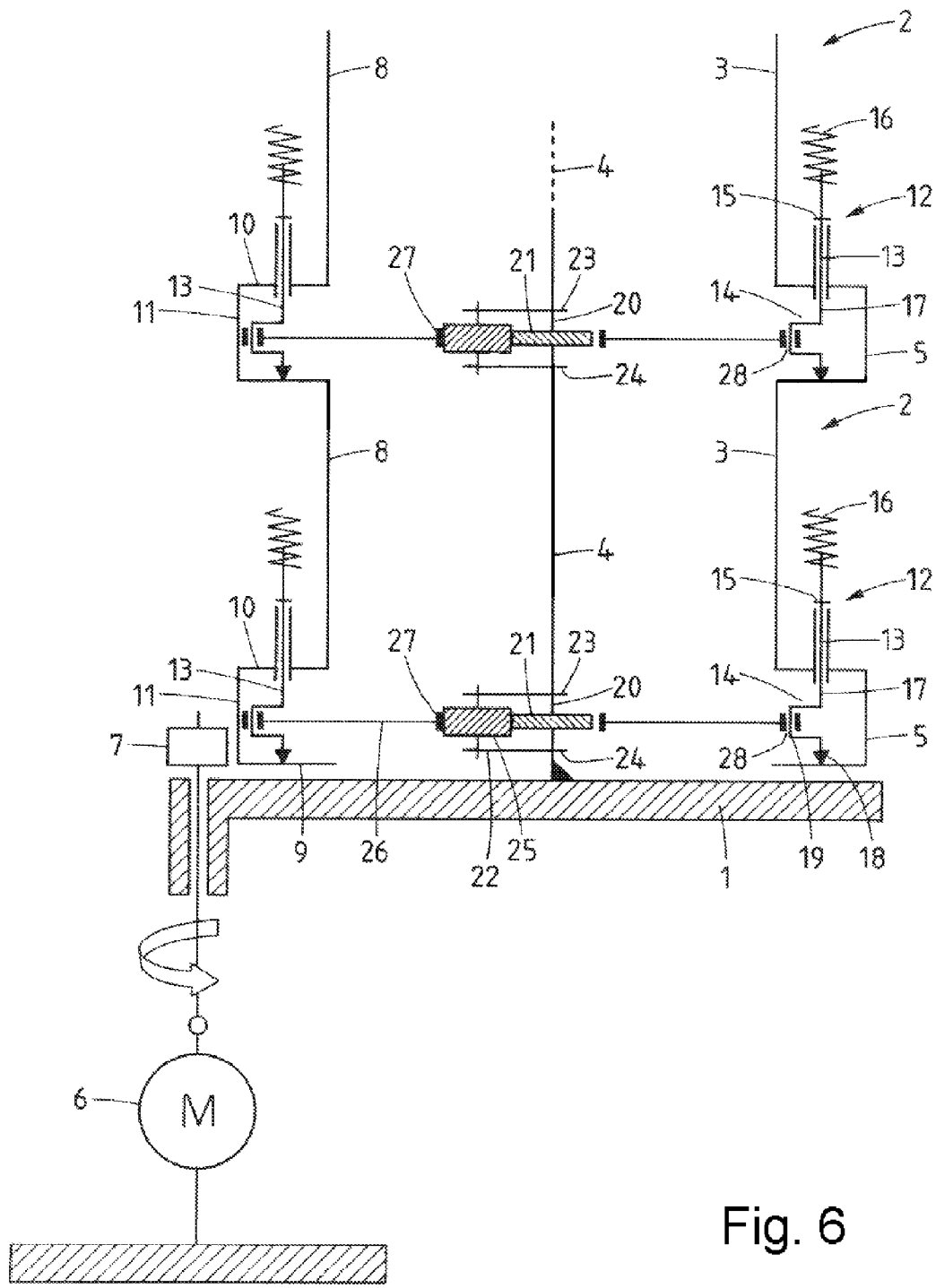
FIG. 6 shows, in schematic form, an axial section through the workpiece carrier device shown in FIG. 1, which includes a second group of identical workpiece holders.

If therefore for example, as in the exemplary embodiment according to FIGS. 4, 5 $Z_Z$=46 and $Z_U$=60, then z is approx. 0.77 and u approx. 0.57. The eccentric motion runs backward in relation to the rotary frame 3. The ratio of the rates of rotation is u−1, i.e. in the example approx. −0.43.

The transmission ratio depends only on z and can easily be changed, for example by exchanging the shaft 20 with the central wheels 21 and the driving parts 22. Thus, for example, a different shaft with smaller central wheels can be used and z thus reduced and the transmission ratio u increased accordingly (2). The engagement with the ring gear of the transmission part then demands larger pinions, although these do not influence the transmission ratio u. If necessary, the transmission parts can additionally be exchanged, although this is more costly.

It is however easily possible to use, instead of a pinion, a more complex intermediate gear set with a plurality of toothed wheels which are mounted on the mount of the driving part and operatively connected to one another and of which one engages with the central toothing and one with the transmission toothing. The transmission ratio u can also be set differently for various groups of workpiece carriers by using a shaft with different intermediate gear sets and/or central wheels.

The configuration of the described exemplary embodiment can also be modified differently without departing from the scope of the invention. Thus, the central toothing does not need to be non-rotatably joined to the base frame. It is for example possible to join the shaft carrying the central wheels to the base frame via an auxiliary gear set driven by the motion of the rotary frame, so that the central toothing performs in each case a rotary motion. An auxiliary gear set of this type can be configured and installed, for example as described in WO 2007/025 397 A1. In this case too, the transmission ratio can easily be changed by exchanging the shaft with the central wheels and driving parts as described above. An embodiment such as is illustrated in FIG. 10 of the aforementioned document, in which a plurality of workpiece carriers, corresponding to that described in connection with the exemplary embodiment, are disposed around a main axle about which the base frame can be rotated by a motor, while the ring gears of their rotary frames engage with a stationary toothed wheel, is also possible.

List of Reference Symbols

1 Base frame
2 Workpiece carrier
3 Rotary frame
4 Driving axle
5 Ring gear
6 Motor
7 Toothed wheel
8 Tubular portion
9 Bottom part
10 Cover
11 Outer ring 12 Group
13 Workpiece holder
14 Base
15 Mount
16 Workpiece
17 Axle pin
18 Bearing pin
19 Driving pin
20 Shaft
21 Central wheel
22 Driving part
23 Upper arm
24 Lower arm
25 Pinion
26 Transmission part
27 Ring gear
28 Driving aperture
29 Output point
30 Inner ring
31 Outer ring
32 Spoke
33 Hole
34 Mount

The invention claimed is:

1. A workpiece carrier device having at least one workpiece carrier, the device comprising:
a rotary frame mounted on a base frame so as to be rotatable about a drive axis,
a driving part which is likewise rotatable about the drive axis in relation to the rotary frame and which comprises a mount rotatable about the drive axis and an intermediate gear set disposed on said mount,
a plurality of workpiece holders which are at a distance from the drive axis and are mounted on the rotary frame so as to be rotatable about holder axes that are parallel to said drive axis,
a central toothing which engages the intermediate gear set and surrounds the drive axis,
at least one rigid transmission part for the purpose of rotating the workpiece holders in relation to the rotary frame, the transmission part being rotatable about an output point which is at a distance of an eccentricity from the drive axis, and having a transmission toothing surrounding the output point wherein the transmission toothing engages with the intermediate gear set and the transmission part further engages with at least two of the workpiece holders at a drive point at a distance of an equal eccentricity from the holder axis in each case; and
wherein the mount rotatable about the drive axis is an upper arm and a lower arm.

2. The workpiece carrier device according to claim 1, wherein the intermediate gear set is realized as a pinion which engages both with the central toothing and with the transmission toothing.

3. The workpiece carrier device according to claim 1, wherein the central toothing points outward and the transmission toothing is realized as an inwardly pointing ring gear disposed on the transmission part.

4. The workpiece carrier device according to claim 1, wherein the central toothing is connected in a torsionally rigid manner to a shaft.

5. The workpiece carrier device according to claim 1, further comprising a central wheel with outer toothing which constitutes the central toothing.

6. The workpiece carrier device according to claim 1, wherein each of the workpiece holders comprises a driving pin, of round cross-section, which is parallel to the holder axis and which engages with a corresponding driving aperture on the transmission part.

7. The workpiece carrier device according to claim 1, wherein the rotary frame is realized as a closed housing which surrounds each driving part and each transmission part, and also in each case the portion of each of the workpiece holders at which the drive point is located, whilst an axle pin of the workpiece holder which carries a mount for securing the workpiece is brought outwards through the housing.

8. The workpiece carrier device according to claim 1, wherein the workpiece carrier comprises a group of the workpiece holders wherein each of the workpiece holders are disposed at the same level around the drive axis, as well as the transmission part which engages with all of the workpiece holders of the group.

9. The workpiece carrier device according to claim 8, wherein the workpiece holders of the group are distributed uniformly over a circle surrounding the drive axis, and the transmission part comprises a ring with driving apertures distributed in a corresponding manner over the same.

10. The workpiece carrier device according to claim 8, wherein the workpiece carrier comprises a plurality of the groups of the workpiece holders, the groups of the workpiece holders being distributed along the drive axis.

11. The workpiece carrier device according to claim 10, wherein the workpiece holders of each of the groups are distributed uniformly over a circle surrounding the drive axis, and a plurality of transmission parts, each of the transmission parts being provided for one of the groups, and each of the transmission parts comprising a ring with driving apertures distributed in a corresponding manner over the same in each case.

12. The workpiece carrier device according to claim 1, wherein a shaft on which the central toothing is mounted is non-rotatable.

13. The workpiece carrier device according to claim 1, wherein a shaft is connected in a torsionally rigid manner to the base frame.

14. The workpiece carrier device according to claim 1, wherein the intermediate gear set is located between the upper arm and the lower arm.

15. The workpiece carrier device according to claim 1, wherein the central toothing is non-rotatably connected to the base frame.

16. A workpiece carrier device with at least one workpiece carrier, the device comprising:
a shaft surrounding a drive axis,
a rotary frame mounted to a base frame so as to be rotatable about the drive axis, workpiece holders mounted on the rotary frame so as to each be rotatable about a holder axis,
a transmission part engaging with the rotatably mounted workpiece holders, and
a driving part with a mount rotatable about the drive axis and an intermediate gear set which engages with the shaft and also engages with the transmission part in such a way that the latter is rotatable about an output point which is at a distance of an eccentricity from the drive axis, and
wherein the mount rotatable about the drive axis is an upper arm and a lower arm.

17. The workpiece carrier device according to claim 16, wherein the transmission part also engages with at least two of the workpiece holders rotatably about a drive point which is distanced by the eccentricity from the holder axis in each case, in order to effect rotation of the said workpiece holders.

18. The workpiece carrier device according to claim 16, wherein the intermediate gear set is located between the upper arm and the lower arm.

19. The workpiece carrier device according to claim 16, wherein the intermediate gear set engages with the shaft via a central wheel non-rotatably connected to the shaft.

20. A workpiece carrier device having at least one workpiece carrier, the device comprising:
- a rotary frame mounted on a base frame so as to be rotatable about a drive axis,
- a driving part which is likewise rotatable about the drive axis in relation to the rotary frame and which comprises a mount rotatable about the drive axis for supporting an intermediate gear set, the mount being an upper arm and a lower arm,
- a plurality of workpiece holders which are at a distance from the drive axis and are mounted on the rotary frame so as to be rotatable about holder axes that are parallel to said drive axis,
- a shaft which engages the intermediate gear set and surrounds the drive axis,
  - at least one rigid transmission part for the purpose of rotating the workpiece holders in relation to the rotary frame, the transmission part being rotatable about an output point which is at a distance of an eccentricity from the drive axis, and-having a transmission toothing surrounding the output point, wherein the transmission toothing engages with the intermediate gear set and the transmission part further engages with at least two of the workpiece holders at a drive point at a distance of an equal eccentricity from the holder axis in each case.

* * * * *